United States Patent
Shanbhag et al.

(10) Patent No.: US 10,900,124 B2
(45) Date of Patent: Jan. 26, 2021

(54) SUBSTRATE PROCESSING CHAMBER WITH SHOWERHEAD HAVING COOLED FACEPLATE

(71) Applicant: LAM RESEARCH CORPORATION, Fremont, CA (US)

(72) Inventors: Damodar Rajaram Shanbhag, Tualatin, OR (US); Nagraj Shankar, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 16/006,355

(22) Filed: Jun. 12, 2018

(65) Prior Publication Data
US 2019/0376183 A1 Dec. 12, 2019

(51) Int. Cl.
| | |
|---|---|
| C23C 16/455 | (2006.01) |
| H01J 37/32 | (2006.01) |
| H01L 21/02 | (2006.01) |
| C23C 16/50 | (2006.01) |
| C23C 16/52 | (2006.01) |
| C23C 16/34 | (2006.01) |
| H01L 21/67 | (2006.01) |

(52) U.S. Cl.
CPC ...... *C23C 16/45565* (2013.01); *C23C 16/345* (2013.01); *C23C 16/50* (2013.01); *C23C 16/52* (2013.01); *H01J 37/32449* (2013.01); *H01J 37/32853* (2013.01); *H01L 21/0217* (2013.01); *H01L 21/02211* (2013.01); *H01L 21/02274* (2013.01); *H01J 2237/002* (2013.01); *H01J 2237/3321* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 5,653,806 A | * | 8/1997 | Van Buskirk | ..... C23C 16/45565 118/666 |
| 5,935,337 A | * | 8/1999 | Takeuchi | .......... C23C 16/45565 118/724 |

(Continued)

FOREIGN PATENT DOCUMENTS

| | | |
|---|---|---|
| JP | 2017063088 A | 3/2017 |
| KR | 102006007227 A | 6/2006 |
| WO | WO-2011017222 A2 | 2/2011 |

OTHER PUBLICATIONS

International Search Report and Written Opinion for PCT Application No. PCT/US2019/035765 dated Sep. 26, 2019.

*Primary Examiner* — Binu Thomas (57) ABSTRACT

A showerhead for a substrate processing chamber includes: inner walls; an inner plenum between the inner walls; and a faceplate having a first surface and a second surface that is opposite the first surface. Holes through the faceplate extend from the first surface to the second surface. A first inlet is fluidly connected to the inner plenum. A first outer plenum is between the inner walls and outer walls. A second outer plenum is between the inner walls and the outer walls. Coolant: fluidly connect the first outer plenum with the second outer plenum; are located within the faceplate between the first and second surfaces; and are fluidly isolated from the holes. The showerhead also includes a second inlet that is fluidly connected to the first outer plenum.

19 Claims, 8 Drawing Sheets

(56) References Cited

U.S. PATENT DOCUMENTS

| | | | | |
|---|---|---|---|---|
| 2002/0092471 A1* | 7/2002 | Kang | ............... | C23C 16/45565 |
| | | | | 118/715 |
| 2009/0173444 A1* | 7/2009 | Sago | ............... | C23C 16/45565 |
| | | | | 156/345.33 |
| 2011/0108195 A1* | 5/2011 | Nishimoto | ........ | H01L 21/67109 |
| | | | | 156/345.37 |
| 2011/0303641 A1* | 12/2011 | Mahadeswaraswamy | .................. | |
| | | | | H01L 21/67109 |
| | | | | 156/345.37 |
| 2013/0174783 A1* | 7/2013 | Suzuki | .............. | C23C 16/45565 |
| | | | | 118/725 |
| 2014/0235069 A1* | 8/2014 | Breiling | ............ | C23C 16/45565 |
| | | | | 118/722 |
| 2015/0007770 A1 | 1/2015 | Chandrasekharan et al. | | |

\* cited by examiner

SUBSTRATE PROCESSING CHAMBER WITH SHOWERHEAD HAVING COOLED FACEPLATE

FIELD

The present disclosure relates to substrate processing systems and more particularly to substrate processing chamber with cooled showerheads.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates, such as semiconductor wafers. Example processes that may be performed on a substrate include, but are not limited to, deposition, etching, cleaning, and other types of processes.

A substrate may be arranged on a substrate support, such as a pedestal or an electrostatic chuck (ESC), in a processing chamber. A showerhead within the processing chamber distributes gases or gas mixtures. Plasma is used to initiate chemical reactions within the processing chamber.

SUMMARY

In a feature, a showerhead for a substrate processing chamber is described. The showerhead includes: inner walls; an inner plenum between the inner walls; a faceplate having a first surface and a second surface that is opposite the first surface; holes through the faceplate that extend from the first surface to the second surface; a first inlet that is fluidly connected to the inner plenum; outer walls; a first outer plenum between the inner walls and the outer walls; a second outer plenum between the inner walls and the outer walls; and coolant channels that: fluidly connect the first outer plenum with the second outer plenum; are located within the faceplate between the first and second surfaces; and are fluidly isolated from the holes. The showerhead also includes a second inlet that is fluidly connected to the first outer plenum.

In further features, a direction of the coolant channels through the faceplate is perpendicular to a second direction of the holes through the faceplate.

In further features, the showerhead includes: a stem portion including a first end and a second end and that includes a first diameter; and a base portion that is connected to the second end of the stem portion and that includes a second diameter that is greater than the first diameter.

In further features, each one of the coolant channels is parallel to each other one of the coolant channels.

In further features, the showerhead further includes an outlet that is fluidly connected to the second outer plenum.

In further features, the showerhead further includes dividing members that are located between the inner walls and the outer walls and that fluidly isolate the first outer plenum from the second outer plenum.

In further features, the showerhead further includes second holes that: extend from the second surface to the coolant channels; and do not extend to the first surface.

In further features, the second holes are parallel to the holes through the faceplate.

In further features, the second holes are fluidly isolated from the holes through the faceplate.

In a feature, a processing system includes: the substrate processing chamber; the showerhead, where the showerhead is located within the substrate processing chamber; a coolant assembly configured to provide a coolant to the second inlet; and a temperature controller configured to control the coolant assembly to cool the coolant to less than or equal to a predetermined temperature during plasma enhanced chemical vapor deposition (PECVD) of a film on a substrate within the substrate processing chamber.

In further features, the film is silicon nitride (SiN).

In further features, the processing system further includes a system controller configured to, via the first inlet, the inner plenum, and the holes, flow silane and a gas including nitrogen into the substrate processing chamber for the PECVD of the film on the substrate.

In further features, the system controller is configured to generate plasma between the showerhead and the substrate.

In further features, the temperature controller is further configured to control the coolant assembly to cool the coolant to less than or equal to the predetermined temperature during cleaning of a film deposited on substrates from within the substrate processing chamber via plasma enhanced chemical vapor deposition (PECVD).

In further features, the film is silicon nitride (SiN).

In further features, the processing system further includes a system controller configured to flow nitrogen triflouride ($NF_3$) into the substrate processing chamber via the first inlet, the inner plenum, and the holes during the cleaning.

In further features, the faceplate consists of aluminum.

In a feature, showerhead for a substrate processing chamber is described. The showerhead includes: an inner plenum; a faceplate having a first surface and a second surface that is opposite the first surface; holes through the faceplate from the first surface to the second surface; a first inlet that is fluidly connected to the inner plenum; a first outer plenum that is located radially outwardly of the inner plenum; a second outer plenum that is located radially outwardly of the inner plenum; and coolant channels that: fluidly connect the first outer plenum with the second outer plenum; are located within the faceplate between the first and second surfaces; and do not intersect with the holes through the faceplate. The showerhead also includes a second inlet that is fluidly connected to the first outer plenum; and an outlet that is fluidly connected to the second outer plenum.

In further features, a processing system includes: the substrate processing chamber; the showerhead, where the showerhead is located within the substrate processing chamber and the faceplate consists of aluminum; and a coolant assembly configured to input a coolant to the second inlet and to receive the coolant from the outlet; and a temperature controller configured to control the coolant assembly to cool the coolant to less than or equal to a predetermined temperature during: plasma enhanced chemical vapor deposition (PECVD) of a film on a substrate within the substrate processing chamber; and during cleaning of the film from within the substrate processing chamber.

In further features, the processing system further includes a system controller configured to: via the first inlet, the inner plenum, and the holes, flow silane and a gas including nitrogen into the substrate processing chamber for the PECVD of the film on the substrate; and via the first inlet, the inner plenum, and the holes, flow nitrogen triflouride (NF$_3$) into the substrate processing chamber during the cleaning, where the film is silicon nitride (SiN).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support supports a substrate in a processing chamber. A showerhead distributes process gases within the processing chamber. For example, during deposition, the showerhead distributes one or more precursor gases to deposit a film on the substrate. During cleaning of the processing chamber, the showerhead distributes one or more cleaning gases to removing the film from the showerhead and other surfaces in the processing chamber.

Cleaning of the processing chamber is performed on an event basis or periodically (e.g., every predetermined number of deposition cycles) before the film begins to flake off of the showerhead and/or other surfaces within the processing chamber. Flakes of the film can land on substrates during deposition, which increases defects.

Showerheads used for deposition (e.g., plasma enhanced chemical vapor deposition (PECVD)) are not cooled. The showerhead according to the present disclosure is cooled during deposition of the film and during cleaning of the processing chamber.

A thickness of the film on the showerhead before flaking begins is related to a temperature of the showerhead. By cooling the showerhead during deposition, a thicker film can be allowed to build up on the showerhead before the film begins to flake off of the showerhead. Cleaning cycles can therefore be performed less frequently when the showerhead is cooled. In other words, more substrates can be processed between consecutive cleaning cycles when the showerhead is cooled.

Cooling the faceplate of the showerhead during cleaning decreases an amount that the showerhead is worn during cleaning. Cooling the showerhead during cleaning may therefore increase a lifetime of the showerhead and increase a period between showerhead replacements.

Figure 1:
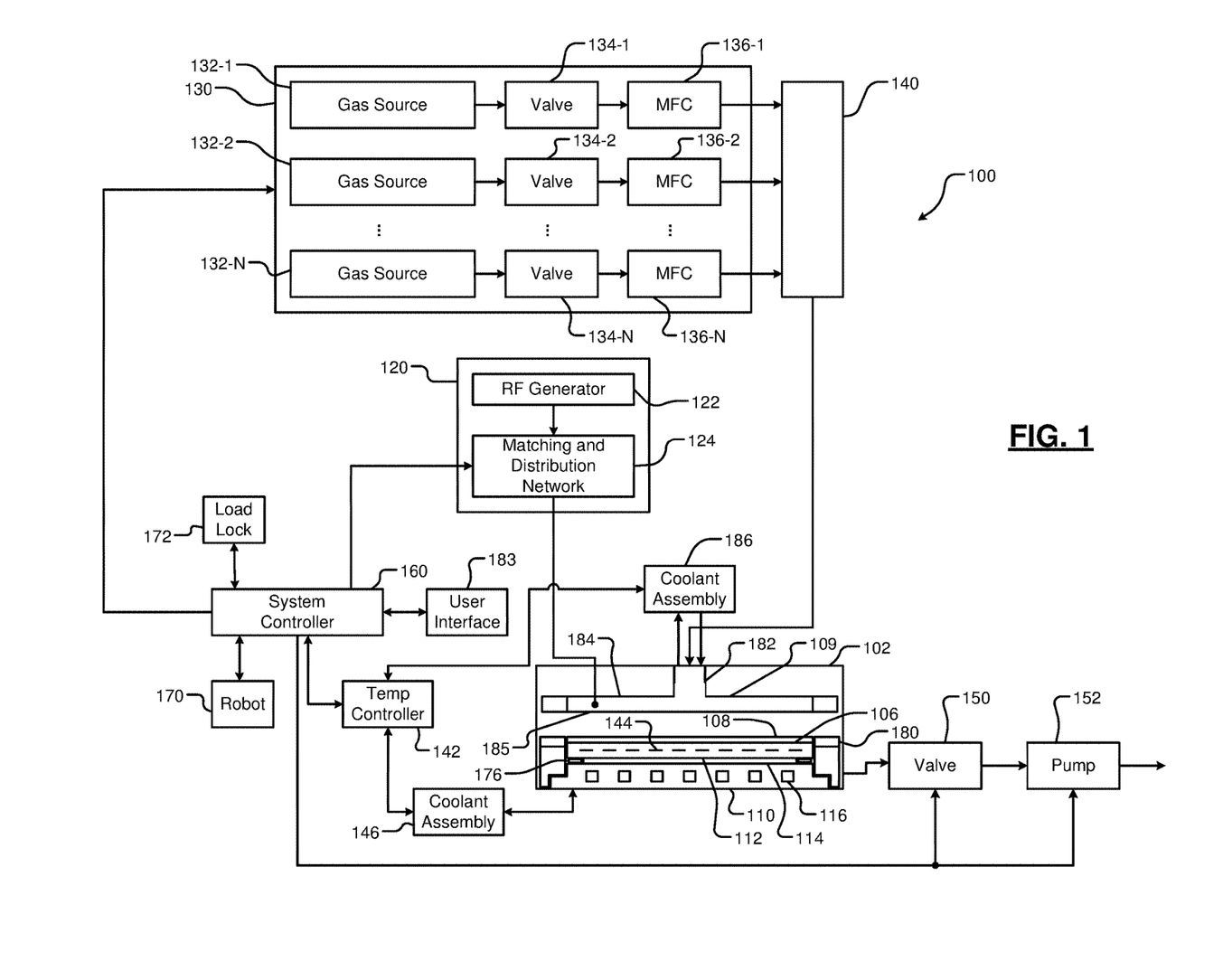
FIG. 1 is a functional block diagram of an example processing chamber.

Referring now to FIG. 1, an example substrate processing system 100 is shown. For example only, the substrate processing system 100 may be used for chemical vapor deposition (CVD), plasma enhanced CVD (PECVD), atomic layer deposition (ALD), plasma enhanced ALD (PEALD), etching, and/or one or more types of processing.

The substrate processing system 100 includes a processing chamber 102 that encloses components of the substrate processing system 100 and contains radio frequency (RF) plasma. While an example of the substrate processing system 100 and the processing chamber 102 are shown, the present disclosure is also applicable to other types of substrate processing systems and processing chambers, such as substrate processing systems that generates plasma in-situ, substrate processing systems that implement remote plasma generation and delivery (e.g., using a plasma tube, a microwave tube), etc.

The processing chamber 102 includes a substrate support 106, such as an electrostatic chuck (ESC). A substrate 108 is arranged on the substrate support 106 and one or more plasma processes are performed on the substrate 108. For example, silicon nitride (SiN) film may be deposited on substrates within the processing chamber 102. While the example of SiN film is provided, the present application is also applicable to the deposition of films of other chemistries.

A showerhead 109 acts as an upper electrode and introduces and distributes process gases within the processing chamber 102. The showerhead 109 is discussed further below.

The substrate support 106 may include an electrically conductive baseplate 110 that acts as a lower electrode. The baseplate 110 supports a ceramic layer 112. A thermal resistance layer 114 (e.g., a bond layer) may be arranged between the ceramic layer 112 and the baseplate 110. The baseplate 110 may include one or more coolant channels 116 for flowing coolant through the baseplate 110. In some examples, a protective seal 176 may be provided around a perimeter of the thermal resistance layer 114 between the ceramic layer 112 and the baseplate 110.

An RF generating system 120 generates and outputs an RF voltage to one of the upper electrode (e.g., the showerhead 109) and the lower electrode (e.g., the baseplate 110 of the substrate support 106) to strike and maintain plasma. The other one of the upper electrode and the lower electrode may be direct current (DC) grounded, alternating current (AC) grounded, or floating. For example only, the RF generating system 120 may include an RF voltage generator 122 that generates the RF voltage that is fed by a matching and distribution network 124 to the upper electrode or the lower electrode.

A gas delivery system 130 includes one or more gas sources 132-1, 132-2, . . . , and 132-N (collectively gas sources 132), where N is an integer greater than zero. The gas sources 132 supply one or more deposition gases, etch gases, carrier gases, inert gases, and mixtures thereof. For example, the gas sources 132 supply one or more precursor gases to deposit the film on substrates. The gas sources 132 may additionally or alternatively supply one or more cleaning gases (e.g., molecular hydrogen) for cleaning of the film from within the processing chamber 102. The gas sources 132 also supply purge gas.

The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. For example only, the output of the manifold 140 is fed to the showerhead 109 and output to the processing chamber 102 from the showerhead 109. While the example of one manifold is provided, the showerhead 109 may receive gas from more than one manifold.

A temperature controller 142 may be connected to a plurality of heating elements, such as thermal control elements (TCEs) 144 arranged in the ceramic layer 112. For example, the TCEs 144 may include, but are not limited to, macro heating elements corresponding to respective zones in a multi-zone heating plate and/or an array of micro heating elements disposed across multiple zones of a multi-zone heating plate. The TCEs 144 may be, for example, resistive heaters that generate heat when power is applied to the heaters, respectively, or another suitable type of heating element. The temperature controller 142 controls the TCEs 144 to control temperatures at various locations on the substrate support 106 and the substrate 108.

The temperature controller 142 also communicates with a coolant assembly 146 and controls coolant (fluid) flow through the coolant channels 116. The coolant may be liquid or gas. The temperature controller 142 operates the coolant assembly 146 to selectively flow the coolant through the coolant channels 116 to cool the substrate support 106. Cooling the substrate support 106 cools a substrate on the substrate support 106. The temperature controller 142 may control the TCEs 144 together with the coolant assembly 146, for example, to achieve one or more target temperatures and/or one or more target coolant flowrates during one or more processes.

A valve 150 and pump 152 may be used to evacuate (purge) reactants and other gases from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

In some examples, the substrate support 106 includes an edge ring 180. The edge ring 180 may be moveable (e.g., moveable upward and downward in a vertical direction) relative to the substrate 108. For example, movement of the edge ring 180 may be controlled via an actuator responsive to the system controller 160. In some examples, a user may input control parameters to the system controller 160 via a user interface 183, which may include one or more input mechanisms, a display, etc.

The showerhead 109 includes a stem portion 182 including one end that may be connected to a top surface of the processing chamber 102. The showerhead 109 also includes a base portion 184 that extends radially outwardly from an opposite end of the stem portion 182 at a location that is spaced from the top surface of the processing chamber 102. The stem portion 182 and the base portion 184 may be made of, for example, aluminum or another suitable electrically conductive material. A faceplate 185 of the base portion 184 of the showerhead 109 includes a substrate-facing surface and includes a plurality of holes through which process gas flows.

The film deposited onto substrates also builds up within the processing chamber 102, such as on interior walls of the processing chamber 102 and the showerhead 109. If the film is not cleaned/removed from within the processing chamber 102, the film may flake off (e.g., the showerhead 109) during deposition of the film and increase defects of substrates.

The system controller 160 periodically performs cleaning cycles of the processing chamber 102, such as each time a predetermined event occurs or each time a predetermined number of substrates have been processed within the processing chamber 102. The predetermined number is calibrated and is set to less than a number of substrates where the film begins to flake off of the showerhead 109 during deposition of the film. The system controller 160 cleans the film from within the processing chamber 102 and the showerhead 109 using plasma and one or more cleaning gasses, such as nitrogen triflouride ($NF_3$). While the example of nitrogen triflouride is provided, another suitable cleaning gas chemistry may be used to clean the film.

According to the present application, via a coolant assembly 186, the temperature controller 142 cools the showerhead 109 during deposition of the film on substrates and during cleaning of the processing chamber 102. The coolant assembly 186 pumps coolant through the showerhead 109 during deposition and during cleaning to cool the faceplate 185 and the showerhead 109.

By cooling the showerhead 109 during deposition, a thicker film can be allowed to build up on the showerhead 109 before the film begins to flake off of the showerhead 109. Cleaning cycles can therefore be performed less frequently. In other words, more substrates can be processed within the processing chamber 102 between consecutive cleaning cycles.

Cooling the faceplate of the showerhead 109 during cleaning decreases wear of the showerhead 109 by the cleaning gases. For example, roughness and emissivity changes of the faceplate 185 attributable to cleaning may be smaller when the showerhead 109 is cooled than if the showerhead 109 is not cooled or indirectly cooled (e.g., via coolant flow through the substrate support 108). Cooling the showerhead 109 during cleaning may therefore increase a lifetime of the showerhead 109 and increase a period between showerhead replacements.

Figure 2:
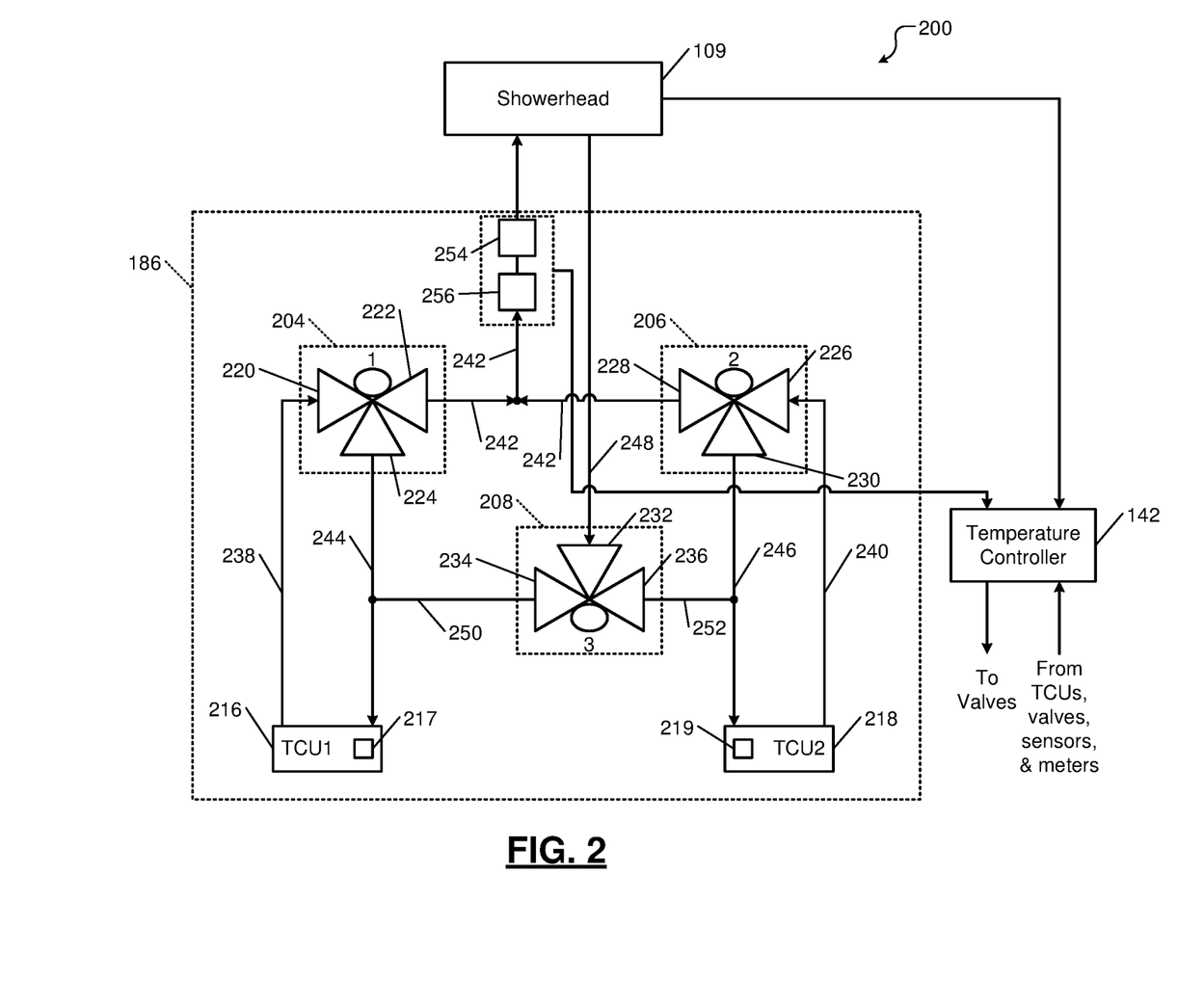
FIG. 2 includes a functional block diagram including an example cooling system including a coolant assembly.

FIG. 2 includes a functional block diagram including an example cooling system 200 including the coolant assembly 186. The cooling system 200 may include a first three-way proportional valve (hereinafter first valve) 204, a second three-way proportional valve (hereinafter second valve) 206, a third three-way proportional valve (hereinafter third valve) 208, and first and second temperature control units (TCUs) (coolant sources) 216 and 218. The first TCU 216 supplies a coolant at a first temperature. The second TCU 218 supplies the coolant at a second temperature. While the example of two TCUs is provided, only one TCU may be implemented or more than two TCUs may be implemented.

In some implementations, the flow rate of each of the first and second TCUs 216 and 218 may be fixed. The flow rates of the first and second TCUs 216 and 218 may be the same or different. For example, the first TCU 216 may have a first fixed flow rate, and the second TCU 218 may have a second fixed flow rate that is the same as or different than the first fixed flow rate. The first and second TCUs 216 and 218 each include a pump. The pump of the first TCU 216 pumps coolant to the first valve 204, and the pump of the second TCU 218 pumps coolant to the second valve 206. The first and second TCUs 216 and 218 each also include one or more heating devices (e.g., electric heaters) and/or one or more cooling devices (e.g., chillers) that heat and/or cool coolant within the first and second TCUs 216 and 218.

The first valve 204 has an input port 220, a first output port 222, and a second output port (or bypass) 224. The second valve 206 has an input port 226, a first output port 228, and a second output port (or bypass) 230. The third valve 208 has an input port 232, a first output port 234, and a second output port 236.

The input port 220 of the first valve 204 receives the coolant at the first temperature from the first TCU 216 at the first fixed flow rate via a first fluid line 238. The input port 226 of the second valve 206 receives the coolant at the second temperature from the second TCU 218 at the second fixed flow rate via a second fluid line 240.

The first output port 222 of the first valve 204 outputs a first portion of the coolant received from the first TCU 216 into a supply line 242. The first output port 228 of the second valve 206 outputs a first portion of the coolant received from the second TCU 218 into the supply line 242. The first portions of the coolant output from the respective first output ports 222 and 228 of the first and second valves 204 and 206 are mixed in the supply line 242. The mixed coolant in the supply line 242 is input to the showerhead 109.

The temperature controller 142 controls the first and second valves 204 and 206 and thereby controls the amounts of the first portions of the coolant that are output from the respective first output ports 222 and 228 of the first and second valves 204 and 206 to the supply line 242. The temperature controller 142 controls the first and second valves 204 and 206 and determines the amounts based on a target (or setpoint) temperature.

The temperature controller 142 sets the target temperature to a predetermined temperature during deposition of the film on a substrate and during cleaning of the processing chamber 102. The predetermined temperature is calibrated and may be, for example, less than or equal to approximately 380 degrees Celsius. In various implementations, the temperature controller 142 may set the target temperature to one predetermined temperature during deposition of the film on a substrate and a second predetermined temperature (different than the first predetermined temperature) during cleaning of the processing chamber 102. The first and second predetermined temperatures are less than or equal to approximately 380 degrees Celsius. As used herein, approximately may mean +/−10 percent of the associated value. In various implementations, the temperature controller 142 may set the target temperature to one or more other temperatures at other times.

A second (remainder) portion of the coolant received by the first valve 204 from the first TCU 216 may be returned to the first TCU 216 via the second output port (or bypass) 224 of the first valve 204 via a fluid line 244. A second (remainder) portion of the coolant received by the second valve 206 from the second TCU 218 may be returned to the second TCU 218 via the second output port (or bypass) 230 of the second valve 206 via a fluid line 246.

Since the second portions of the coolant received by the first and second valves 204 and 206 are returned to the first and second TCUs 216 and 218, the first and second TCUs 216 and 218 can supply the coolant to the first and second valves 204 and 206 at the respective fixed flow rates. This may simplify the design of the first and second TCUs 216 and 218. For example, the pumps of the first and second TCUs 216 and 218 can be operated at single speeds. While operating at the single speeds, the target temperature may be achieved via adjusting the openings of the first and/or second valves 204 and 206.

The coolant output from the showerhead 109 is received by the input port 232 of the third valve 208 via a return line 248. The third valve 208 divides the returned coolant between the first and second TCUs 216 and 218. A first portion of the coolant received by the third valve 208 is returned to the first TCU 216 via the first output port 234 of the third valve 208 through a fluid line 250 and the fluid line 244. A second portion of the coolant received by the third valve 208 is returned to the second TCU 218 via the second output port 236 of the third valve 208 through a fluid line 252 and the fluid line 246.

The temperature controller 142 controls the third valve 208 and determines the appropriate or target amounts of the first and second portions of the coolant that are output from the first and second output ports 234 and 236 of the third valve 208 to the first and second TCUs 216 and 218, respectively. For example, the temperature controller 142 monitors the level of the coolant in the first and second TCUs 216 and 218 based on data received from level sensors 217 and 219 in the first and second TCUs 216 and 218. The temperature controller 142 determines the level of the coolant in each of the first and second TCUs 216 and 218 and determines the amounts of the first and second portions of the coolant to return to the first and second TCUs 216 and 218 based on the levels.

A temperature sensor 254 (e.g., a thermocouple) senses the temperature of the coolant input to the showerhead 109. A flow rate sensor (e.g., a flow meter) 256 measures a flow rate of the coolant input to the showerhead 109 through the supply line 242. While not shown, a second temperature sensor and a second flow meter can be coupled to the return line 248 and measure a temperature and a flow rate of the coolant through the return line 248.

The temperature controller 142 may include a proportional integral derivative (PID) controller or another suitable type of closed loop controller. The temperature controller 142 controls the amount of coolant supplied by the first and second valves 204 and 206 based on the target temperature at which the coolant is to be supplied to the showerhead 109. For example, the temperature controller 142 may control the first and second valves 204 and 206 to adjust the temperature measured by the temperature sensor 254 toward or to the target temperature.

Additionally, the temperature controller 142 controls the amount of coolant supplied by the first and second valves 204 and 206 based on a target flow rate at which the coolant is to be supplied to the showerhead 109. For example, the temperature controller 142 may control the first and second valves 204 and 206 to adjust the flowrate measured by the flow rate sensor 256 toward or to the target flow rate.

Figure 3:
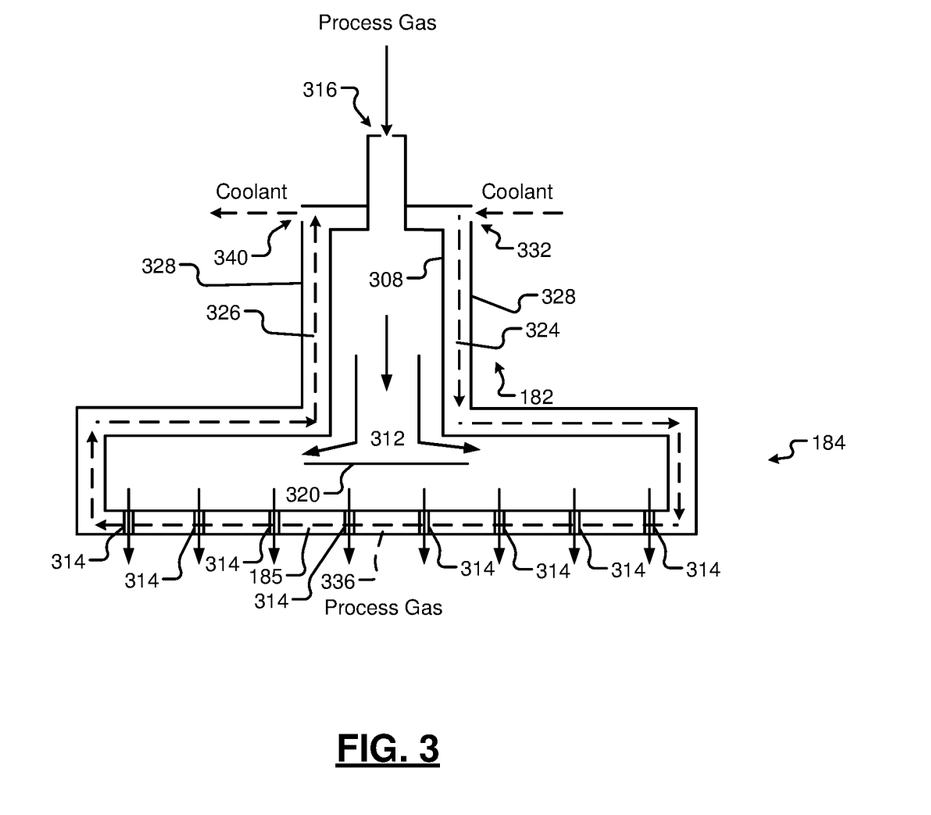
FIG. 3 includes a cross-sectional view of an example showerhead.

FIG. 3 is a cross-sectional view of an example of the showerhead 109. As stated above, the showerhead 109 includes the stem portion 182 and the base portion 184. The base portion 184 includes the faceplate 185.

An inner plenum 312 is located between inner walls 308. Process gas flows into the inner plenum 312 from the manifold 140 via a first inlet 316. Processes gas flows from the inner plenum 312 into the processing chamber 102 via holes 314 through the faceplate 185. A baffle 320 may be implemented within the inner plenum 312. The baffle 320 may be configured to distribute process gas radially outwardly within the inner plenum 312.

First and second outer plenums 324 and 326 are located between the inner walls 308 and outer walls 328 of the showerhead 109. Coolant flows into the first outer plenum 324 from the coolant assembly 186 via a second inlet 332. Coolant flows from the first outer plenum 324 to the second outer plenum 326 via coolant channels 336 through the faceplate 185. The coolant channels 336 are formed between the holes 314 through the faceplate 185. The coolant channels 336 are distributed throughout the faceplate 185 such that temperatures across the faceplate 185 are approximately equal. Coolant flows from the second outer plenum 326 to the coolant assembly 186 via an outlet 340. The coolant channels 336 may be perpendicular to the holes 314.

Figure 4:
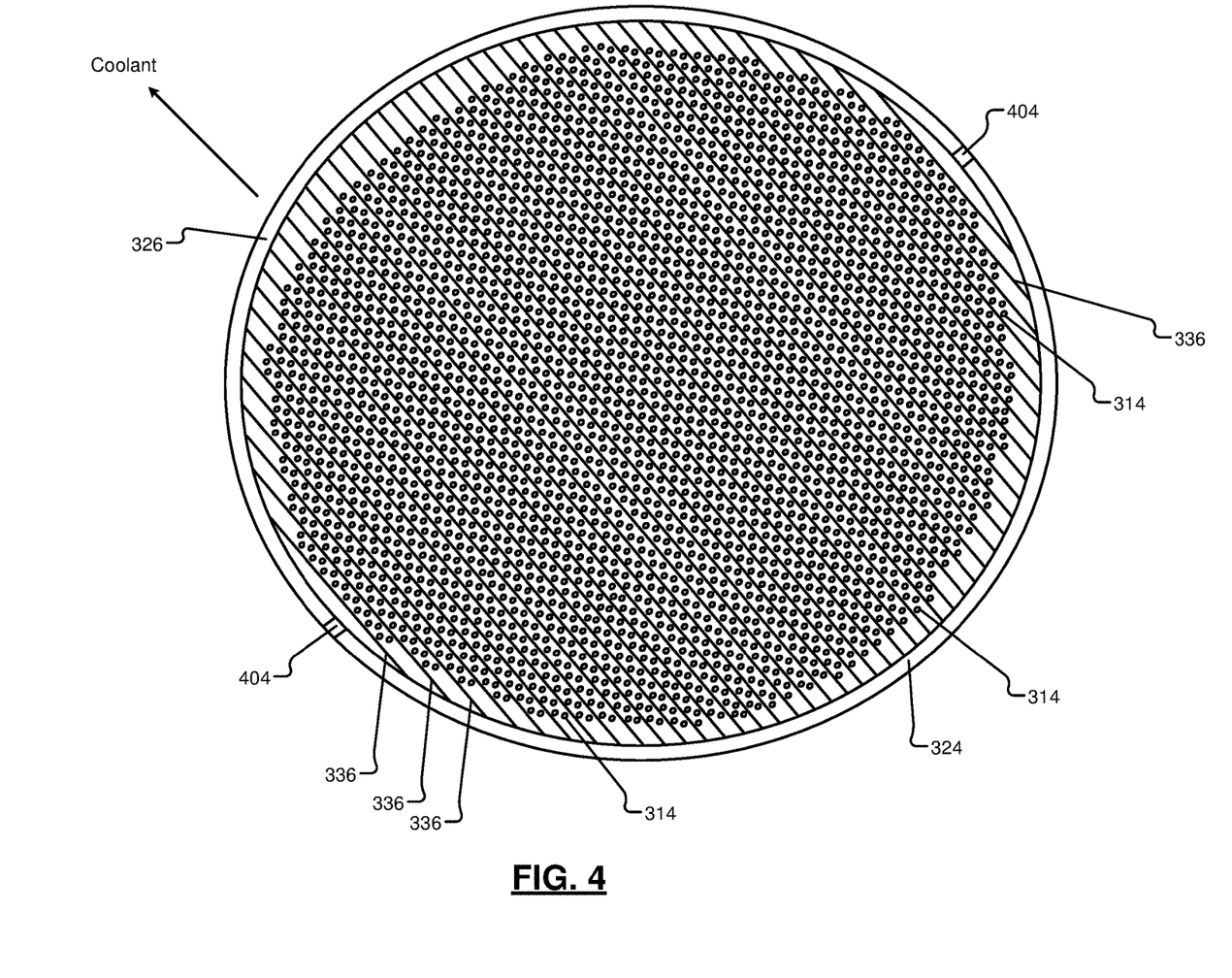
FIG. 4 includes a bottom view of an example showerhead.

FIG. 4 includes a bottom view of an example implementation of the showerhead 109 viewed toward the faceplate 185. In FIG. 4, material between the coolant channels 336 and the substrate-facing surface of the faceplate 185 has been removed to illustrate the coolant channels 336 and the holes 314.

Dividing members 404 extend through the stem portion 182 and the base portion 184. The dividing members 404 divide the first outer plenum 324 from the second outer plenum 326 such that coolant can only flow from the first outer plenum 324 to the second outer plenum 326 through the coolant channels 336. The dividing members 404 may be located, for example, 180 degrees from each other around the showerhead 109. Each of the coolant channels 336 may be parallel to each other one of the coolant channels 336. Distances between adjacent ones of the coolant channels 336 may be the same, different, or a combination of the same and different distances.

While example numbers and arrangements of holes are provided, the present application is also applicable to other numbers and/or arrangements of holes. Also, while example numbers and arrangements of coolant channels are provided, the present application is also applicable to other numbers and/or arrangements of coolant channels.

Figure 5:
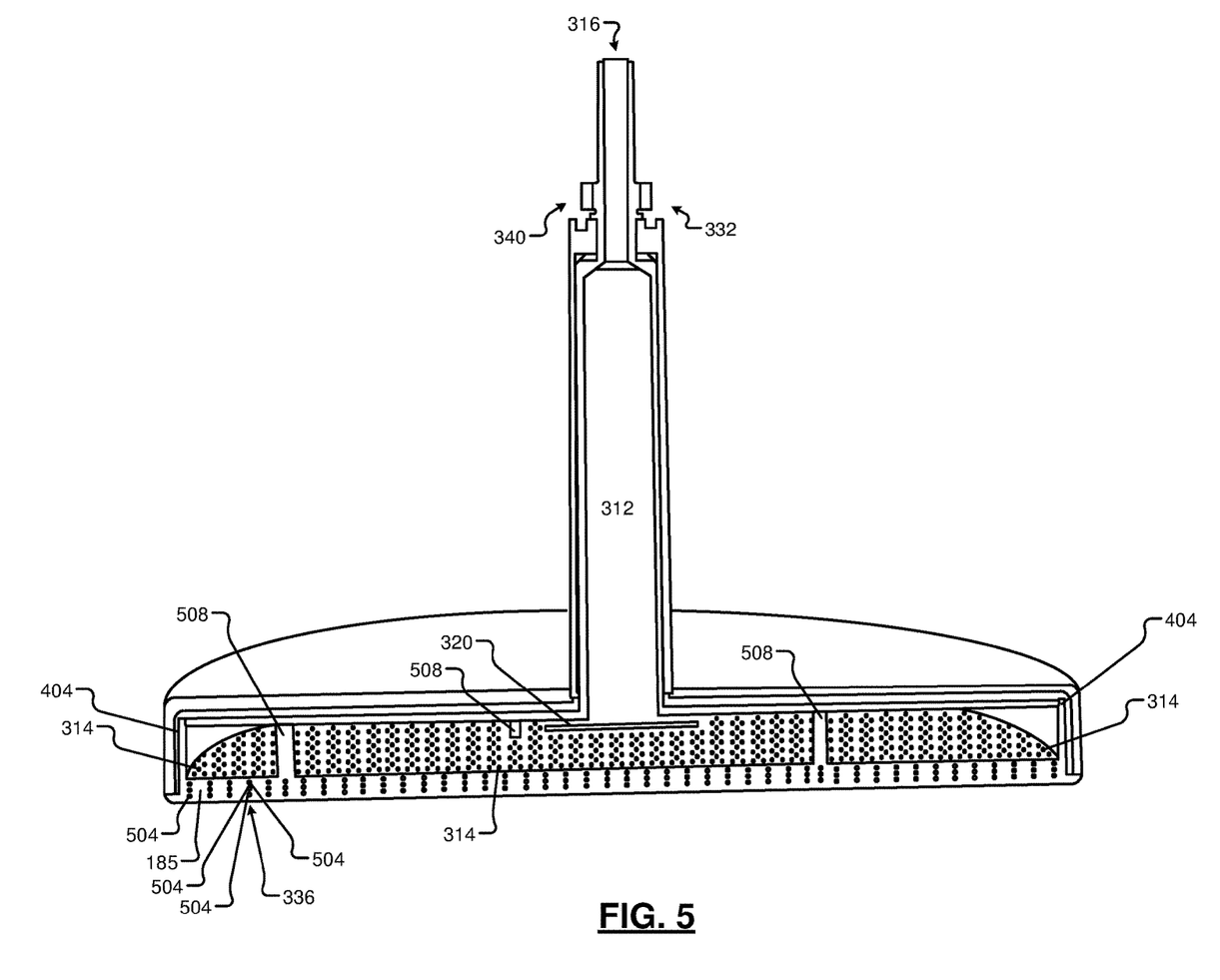
FIG. 5 includes a cross-sectional view of an example showerhead.

FIG. 5 includes a cross-sectional view of the example implementation of the showerhead 109. In the example of FIG. 5, the cross-section is taken at the dividing members 404. As shown, each of the coolant channels 336 may include a set of two or more individual coolant channels 504. While the example of three individual coolant channels 504 is provided, each of the coolant channels 336 may include one, two, or more than two individual coolant channels. Cooling of the faceplate 185 may be more even across the showerhead when each of the coolant channels 336 includes two or more individual coolant channels. Separation members 508 may be implemented within the inner plenum 312 in various implementations.

Figure 6:
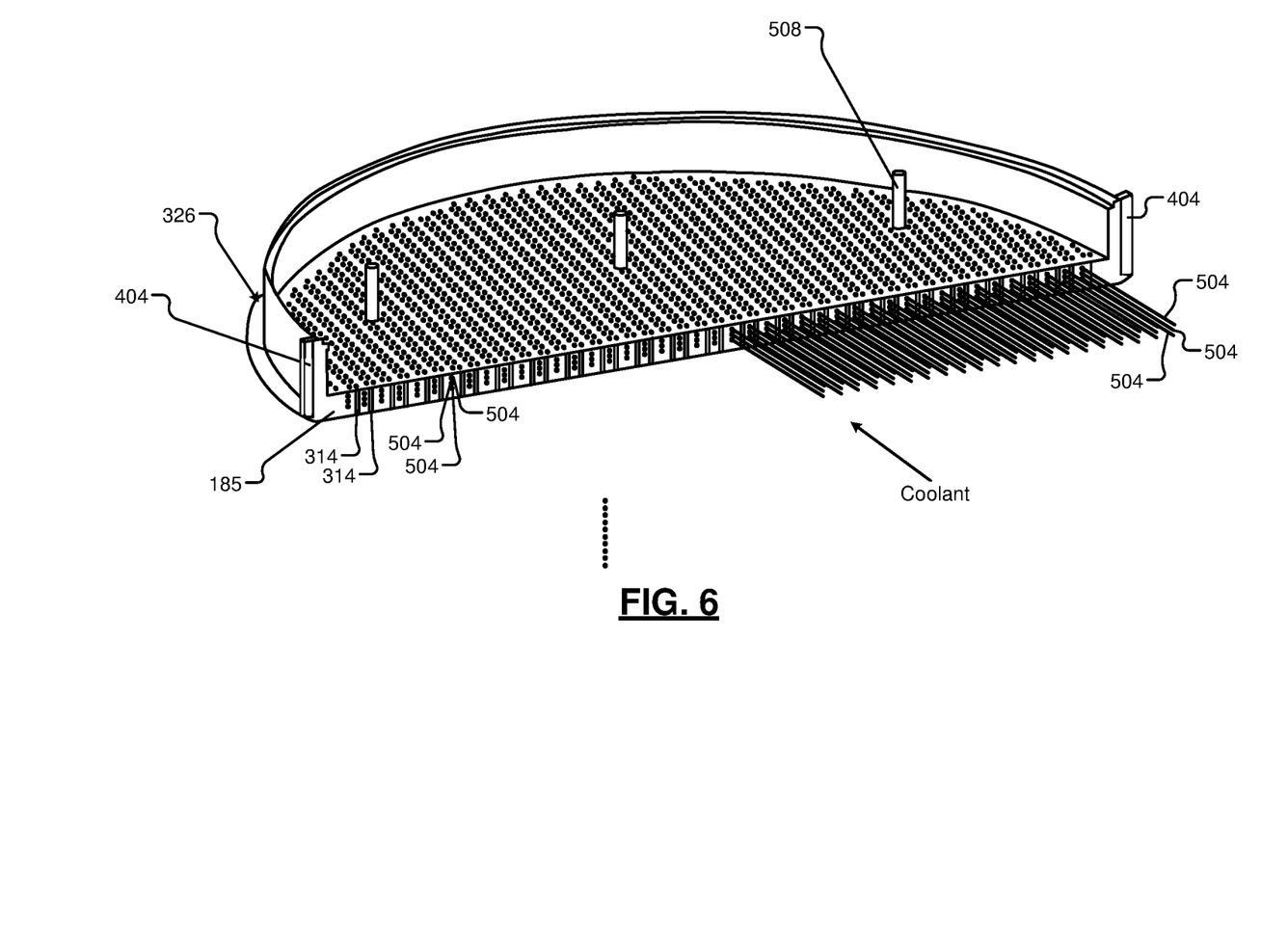
FIGS. 6 and 7 include three-dimensional cross-sectional views of example base portions of a showerhead.

FIG. 6 includes a three-dimensional cross-sectional view of an example implementation of the base portion 184 of the showerhead 109. In the example of FIG. 6, the cross-section is again taken at the dividing members 404. The lengths of the coolant channels 336 have been truncated for purposes of illustration only. The coolant channels 336 extend to radial outer edges of the showerhead 109 where the coolant channels 336 open to the first and second outer plenums 324 and 326. In the example of FIG. 6, the outer walls 328 forming the outer walls of the first and second outer plenums 324 and 326 are not shown.

Figure 7:
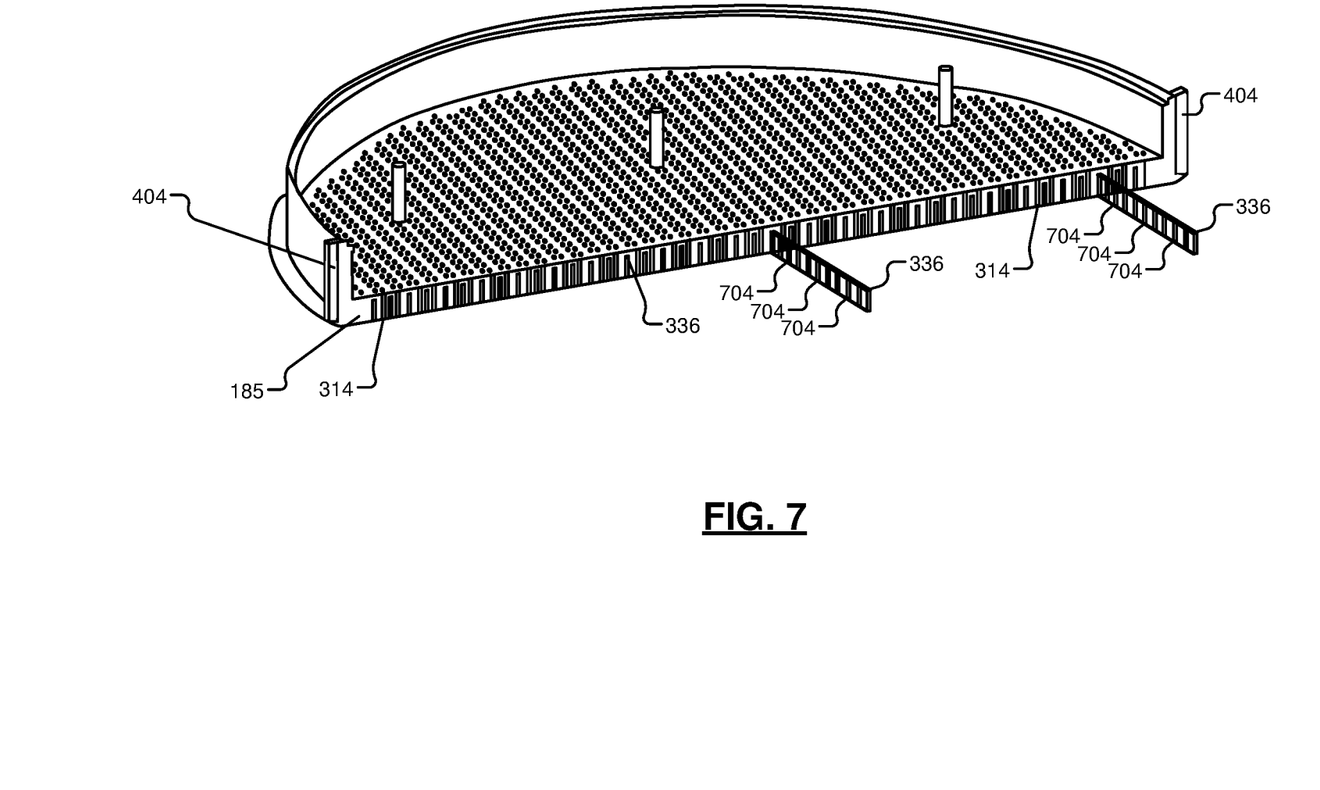

FIG. 7 includes a three-dimensional cross-sectional view of an example implementation of the base portion 184 of the showerhead 109. In various implementations, the coolant may both cool the showerhead 109 and be injected into the processing chamber 102. Specifically, holes 704 may be formed through the faceplate 185 to the coolant channels 336 such that the coolant flows from the coolant channels 336 into the processing chamber 102. In various implementations, the dividing members 404 may be omitted such that the first and second outer plenums 324 and 326 are not separated and the showerhead 109 includes one outer plenum. In such embodiments, the outlet 340 may be omitted and may be replaced with one or more additional coolant inlets.

The lengths of the coolant channels 336 have again been truncated for purposes of illustration only. The coolant channels 336 extend to radial outer edges of the showerhead 109 where the coolant channels 336 open to the first and second outer plenums 324 and 326. In the example of FIG. 7, the outer walls 328 forming the outer walls of the first and second outer plenums 324 and 326 are not shown.

Figure 8:
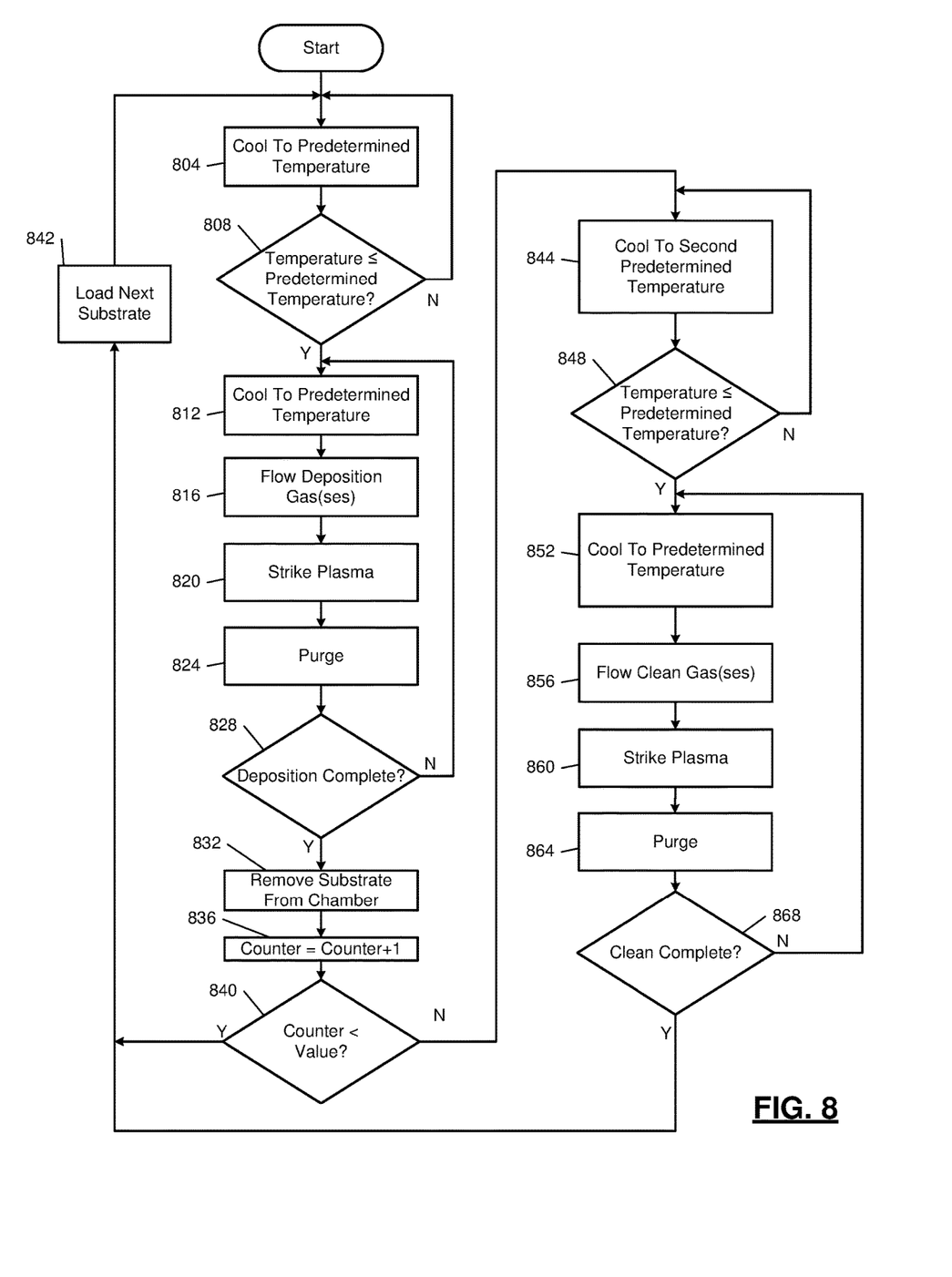
FIG. 8 includes a flowchart depicting an example method of cooling a showerhead during (a) deposition of a film on substrates and (b) cleaning of a processing chamber.

FIG. 8 includes a flowchart depicting an example method of cooling the showerhead 109 during deposition of a film on substrates and during cleaning of the processing chamber 102. Control may begin with a substrate arranged on the substrate support 106 within the processing chamber 102. At 804, the temperature controller 142 controls the coolant assembly 186 to provide coolant to the showerhead 109 at the predetermined temperature (e.g., approximately 380 degrees Celsius or less) for deposition of the film (e.g., silicon nitride) of the substrate.

At 808, the system controller 160 may determine whether the temperature of coolant is less than or equal to the predetermined temperature. If 808 is true, control continues with 812. If 808 is false, control may return to 804 to continue cooling the showerhead 109. In various implementations, 808 may be omitted.

At 812, deposition of the film on the substrate begins, and the temperature controller 142 continues to control the coolant assembly 186 to provide coolant to the showerhead 109 at the predetermined temperature for deposition of the film on the substrate. At 816, the system controller 160 controls the gas delivery system 130 to provide one or more precursor gases (e.g., silane ($SiH_4$) and a gas including nitrogen (e.g., molecular nitrogen ($N_2$), nitrous oxide ($N_2O$))) to the processing chamber 102 via the showerhead 109 to deposit the film on the substrate. One or more inert (carrier) gases (e.g., argon or helium) may also be provided to the processing chamber 102 via the showerhead 109 to deposit the film on the substrate.

At 820, the system controller 160 controls the RF generating system 120 to strike plasma within the processing chamber 102 to deposit the film (e.g., silicon nitride) on the substrate. By cooling the showerhead 109 and the faceplate 185 during the deposition, a thicker layer of the film can be allowed to form on the faceplate 185 without the film flaking off of the showerhead 109. This allows for more substrates to be processed within the processing chamber 102 between consecutive clean cycles of the processing chamber 102.

At 824, the system controller 160 may open the valve 150 and turn on the pump 152 to purge gas from the processing chamber 102. In various implementations, 824 may be omitted or performed after deposition is complete.

At 828, the system controller 160 determines whether deposition of the film on the substrate is complete. For example, the system controller 160 may determine whether a period since the deposition of the film on the substrate began (e.g., since a first instance of 812) is greater than a predetermined deposition period. If 828 is true, control continues with 832. If 828 is false, control may return to 812 and continue the deposition.

At 832, the robot 170 or another robot may remove the substrate from the processing chamber 102. The robot 170 or another robot may move the substrate to another processing chamber for additional processing. Alternatively, additional processing may be performed on the substrate within the processing chamber 102.

At 836, the system controller 160 may increment a counter value (e.g., add 1 to the counter value). The counter value therefore corresponds to the number of substrates upon which the film has been deposited within the processing chamber 102 since the processing chamber 102 was last cleaned to remove the film from within the processing chamber 102.

The system controller 160 may determine whether the counter value is less than a predetermined value at 840. The predetermined value may be calibrated and is an integer greater than one. The predetermined value corresponds to the number of substrates to be processed (with the film being deposited on the substrates) between consecutive cleaning cycles of the processing chamber 102. If 840 is true, the robot 170 or another robot may load a next substrate onto the substrate support 106 within the processing chamber 102 at 842, and control may return to 804 to begin deposition of the film on the next substrate. If 820 is false, control may continue with 844. In various implementations, cleaning cycles of the processing chamber 102 may additionally or alternatively be performed each predetermined period of time and/or in response to user input to perform cleaning.

At 844, the temperature controller 142 controls the coolant assembly 186 to provide coolant to the showerhead 109 at the predetermined temperature for cleaning. At 848, the system controller 160 may determine whether the temperature of coolant is less than or equal to the predetermined temperature. If 848 is true, control continues with 852. If 848 is false, control may return to 844 to continue cooling the showerhead 109. In various implementations, 848 may be omitted.

At 852, cleaning begins and the temperature controller 142 continues to control the coolant assembly 186 to provide coolant to the showerhead 109 at the predetermined temperature for cleaning. At 856, the system controller 160 controls the gas delivery system 130 to provide one or more cleaning gases (e.g., nitrogen triflouride ($NF_3$)) to the processing chamber 102 via the showerhead 109 to clean the film (e.g., silicon nitride) from within the processing chamber 102 and the showerhead 109.

At 860, the system controller 160 also controls the RF generating system 120 to strike plasma within the processing chamber 102 to clean the film (e.g., silicon nitride) from within the processing chamber 102. By cooling the showerhead 109 to the predetermined temperature during the cleaning, changes (e.g., roughness and emissivity) of the showerhead 109 attributable to cleaning decreases. This minimizes wear of the showerhead and allows for a longer period of use of the showerhead 109 before the showerhead 109 is replaced.

The film vaporizes and can be evacuated from the processing chamber 102 via operation of the pump 152. At 864, the system controller 160 may open the valve 150 and turns on the pump 152 to purge the vaporized film from the processing chamber 102. In various implementations, 864 may be omitted or performed after cleaning is complete.

At 868, the system controller 160 determines whether the cleaning is complete. For example, the system controller 160 may determine whether a period since the cleaning began (e.g., since a first instance of 852) is greater than a predetermined cleaning period. If 868 is true, control may transfer to 842, as discussed above. If 868 is false, control may return to 852 and continue the cleaning of the processing chamber 102.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A showerhead for a substrate processing chamber, the showerhead comprising:
   a stem portion including a first end and a second end and that includes a first diameter;
   a base portion that is connected to the second end of the stem portion and that includes a second diameter that is greater than the first diameter;
   inner walls;
   an inner plenum between the inner walls;
   the base portion including a faceplate having a first surface and a second surface that is opposite the first surface;
   holes through the faceplate that extend from the first surface to the second surface;
   a first inlet that is fluidly connected to the inner plenum;
   outer walls;
   a first outer plenum in the stem portion and the base portion and defined by the inner walls and the outer walls;
   a second outer plenum in the stem portion and the base portion and defined by the inner walls and the outer walls;
   coolant channels that:
      fluidly connect the first outer plenum with the second outer plenum;
      are located within the faceplate between the first and second surfaces; and
      are fluidly isolated from the holes,
      wherein each of the coolant channels include multiple vertically displaced coolant channels; and
   a second inlet that is fluidly connected to the first outer plenum.

2. The showerhead of claim 1 wherein a direction of the coolant channels through the faceplate is perpendicular to a second direction of the holes through the faceplate.

3. The showerhead of claim 1 wherein each one of the coolant channels is parallel to each other one of the coolant channels.

4. The showerhead of claim 1 further comprising an outlet that is fluidly connected to the second outer plenum.

5. The showerhead of claim 1 further comprising dividing members that are located between the inner walls and the outer walls and that fluidly isolate the first outer plenum from the second outer plenum.

6. The showerhead of claim 1 further comprising second holes that:
   extend from the second surface to the coolant channels;
   are fluidly connected to the coolant channels; and
   do not extend to the first surface.

7. The showerhead of claim 6 wherein the second holes are fluidly isolated from the holes through the faceplate.

8. A processing system comprising:
   the substrate processing chamber;
   the showerhead of claim 1, wherein the showerhead is located within the substrate processing chamber;
   a coolant assembly configured to provide a coolant to the second inlet; and
   a temperature controller configured to control the coolant assembly to cool the coolant to less than or equal to a predetermined temperature during plasma enhanced chemical vapor deposition (PECVD) of a film on a substrate within the substrate processing chamber.

9. The processing system of claim 8 wherein the film is silicon nitride (SiN).

10. The processing system of claim 9 further comprising a system controller configured to, via the first inlet, the inner plenum, and the holes, flow silane and a gas including nitrogen into the substrate processing chamber for the PECVD of the film on the substrate.

11. The processing system of claim 10 wherein the system controller is configured to generate plasma between the showerhead and the substrate.

12. The processing system of claim 8 wherein the temperature controller is further configured to control the coolant assembly to cool the coolant to less than or equal to the predetermined temperature during cleaning of a film deposited on substrates from within the substrate processing chamber via plasma enhanced chemical vapor deposition (PECVD).

13. The processing system of claim 12 wherein the film is silicon nitride (SiN).

14. The processing system of claim 12 further comprising a system controller configured to flow nitrogen triflouride ($NF_3$) into the substrate processing chamber via the first inlet, the inner plenum, and the holes during the cleaning.

15. The processing system of claim 14 wherein the faceplate consists of aluminum.

16. The showerhead of claim 6 wherein the second holes are parallel to the holes through the faceplate.

17. A showerhead for a substrate processing chamber, the showerhead comprising:
   a stem portion including a first end and a second end and that includes a first diameter;
   a base portion that is connected to the second end of the stem portion and that includes a second diameter that is greater than the first diameter;
   an inner plenum;
   the base portion including a faceplate having a first surface and a second surface that is opposite the first surface;
   holes through the faceplate from the first surface to the second surface;
   a first inlet that is fluidly connected to the inner plenum;
   a first outer plenum in the stem portion and the base portion and that is located radially outwardly of the inner plenum;
   a second outer plenum in the stem portion and the base portion and that is located radially outwardly of the inner plenum;
   coolant channels that:
      fluidly connect the first outer plenum with the second outer plenum;
      are located within the faceplate between the first and second surfaces; and
      do not intersect with the holes through the faceplate, wherein each of the coolant channels include multiple vertically displaced coolant channels;
   a second inlet that is fluidly connected to the first outer plenum; and
   an outlet that is fluidly connected to the second outer plenum.

18. A processing system comprising:
   the substrate processing chamber;
   the showerhead of claim 17, wherein the showerhead is located within the substrate processing chamber and the faceplate consists of aluminum;
   a coolant assembly configured to input a coolant to the second inlet and to receive the coolant from the outlet; and
   a temperature controller configured to control the coolant assembly to cool the coolant to less than or equal to a predetermined temperature during:
      plasma enhanced chemical vapor deposition (PECVD) of a film on a substrate within the substrate processing chamber; and
      during cleaning of the film from within the substrate processing chamber.

19. The processing system of claim 18 further comprising a system controller configured to:
   via the first inlet, the inner plenum, and the holes, flow silane and a gas including nitrogen into the substrate processing chamber for the PECVD of the film on the substrate; and
   via the first inlet, the inner plenum, and the holes, flow nitrogen triflouride ($NF_3$) into the substrate processing chamber during the cleaning,
   wherein the film is silicon nitride (SiN).

* * * * *